United States Patent
Paton et al.

(10) Patent No.: US 6,680,250 B1
(45) Date of Patent: Jan. 20, 2004

(54) FORMATION OF DEEP AMORPHOUS REGION TO SEPARATE JUNCTION FROM END-OF-RANGE DEFECTS

(75) Inventors: Eric N. Paton, Morgan Hill, CA (US); Robert B. Ogle, San Jose, CA (US); Cyrus E. Tabery, Sunnyvale, CA (US); Qi Xiang, San Jose, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/145,740

(22) Filed: May 16, 2002

(51) Int. Cl.$^7$ ............................................. H01L 21/44
(52) U.S. Cl. .................... 438/660; 438/482; 438/486; 438/546
(58) Field of Search ................ 438/482, 486, 438/487, 546, 545, 549, 660, 662

(56) References Cited

U.S. PATENT DOCUMENTS

| | | | | |
|---|---|---|---|---|
| 5,245,208 A | * | 9/1993 | Eimori ........................... 257/344 |
| 5,529,951 A | * | 6/1996 | Noguchi et al. ............... 437/174 |
| 5,793,090 A | * | 8/1998 | Gardner et al. ............... 257/408 |
| 5,953,616 A | * | 9/1999 | Ahn ............................... 438/305 |
| 5,969,407 A | * | 10/1999 | Gardner et al. ............... 257/607 |
| 6,391,731 B1 | * | 5/2002 | Chong et al. .................. 438/303 |
| 6,426,278 B1 | * | 7/2002 | Nowak et al. ................. 438/528 |
| 6,548,361 B1 | * | 4/2003 | En et al. ........................ 438/301 |
| 2002/0098689 A1 | * | 7/2002 | Chong et al. ................. 438/655 |
| 2003/0040130 A1 | * | 2/2003 | Mayur et al. ................... 438/14 |

\* cited by examiner

Primary Examiner—Matthew Smith
Assistant Examiner—Renzo N Rocchegiani

(57) ABSTRACT

A method of manufacturing a MOSFET semiconductor device includes forming a gate electrode over a substrate and a gate oxide between the gate electrode and the substrate. Inert dopants are then implanted within the substrate to form amorphized source/drain regions in the substrate extending to a first depth significantly greater than the intended junction depth. The amorphized source/drain regions are implanted with source/drain dopants such that the dopants extend into the substrate to a second depth less than the first depth, above and spaced apart from the end-of-range defect region created at the first depth by the amorphization process. Laser thermal annealing recrystallizes the amorphous regions, activates the source/drain regions and forms source/drain junctions. Because the recrystallization front velocity towards the substrate main surface is greater than the dopant atom velocity in the liquid substrate during laser thermal annealing, the junctions are not pushed down to the amorphous/crystalline silicon interface. Thus, end-of-range defects are located in a region below and spaced apart from the junctions, and the defects are not located in the activated source/drain regions. Junction leakage as a result of the end-of-range defects is thereby reduced.

12 Claims, 4 Drawing Sheets

US 6,680,250 B1

FORMATION OF DEEP AMORPHOUS REGION TO SEPARATE JUNCTION FROM END-OF-RANGE DEFECTS

FIELD OF THE INVENTION

The present invention relates to manufacturing of semiconductor devices, and more particularly, to laser anneal processes that minimize the unwanted effects of end-of-range defects.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. The MOS transistor is one of the basic building blocks of most modern electronic circuits. Importantly, these electronic circuits realize improved performance and lower costs, as the performance of the MOS transistor is increased and as manufacturing costs are reduced.

A typical MOS semiconductor device includes a semiconductor substrate on which a gate electrode is disposed. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOS transistor is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

MOS devices typically fall in one of two groups depending on the type of dopants used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with n-type impurities (e.g., arsenic or phosphorous). Conversely, the channel of a p-channel MOS (PMOS) device under the transverse electric field is associated with p-type impurities (e.g., boron).

A type of device, commonly referred to as a MOS field-effect-transistor (MOSFET), includes a channel region formed in the semiconductor substrate beneath the gate area or electrode and between the source and drain regions. The channel is typically lightly doped with a dopant having a conductivity type opposite to that of the source/drain regions. The gate electrode is generally separated from the substrate by an insulating layer, typically an oxide layer such as $SiO_2$. The insulating layer is provided to prevent current from flowing between the gate electrode and the source, drain or channel regions. In operation, a voltage is typically developed between the source and drain terminals. When an input voltage is applied to the gate electrode, a transverse electric field is set up in the channel region. By varying the transverse electric field, it is possible to modulate the conductance of the channel region between the source and drain regions. In this manner an electric field is used to control the current flow through the channel region.

The semiconductor industry is continually striving to improve the performance of MOSFET devices. The ability to create devices with sub-micron features has allowed significant performance increases, for example, from decreasing performance degrading resistances and parasitic capacitances. The attainment of sub-micron features has been accomplished via advances in several semiconductor fabrication disciplines. For example, the development of more sophisticated exposure cameras in photolithography, as well as the use of more sensitive photoresist materials, have allowed sub-micron features, in photoresist layers, to be routinely achieved. Additionally, the development of more advanced dry etching tools and processes have allowed the sub-micron images in photoresist layers to be successfully transferred to underlying materials used in MOSFET structures.

As the distance between the source region and the drain region of the MOSFET (i.e., the physical channel length) decreases, in the effort to increase circuit speed and complexity, the junction depth of source/drain regions must also be reduced to prevent unwanted source/drain-to-substrate junction capacitance. However, obtaining these smaller junction depths tests the capabilities of current processing techniques, such as ion implantation with activation annealing using rapid thermal annealing. Rapid thermal annealing typically involves heating the silicon wafer, after implanting, under high-intensity heat lamps. Implanting or doping amorphitizes the silicon substrate, and the activation annealing is used to recrystallize the amorphitized silicon region.

As a result of the limitations of rapid thermal annealing, laser thermal annealing is being implemented, particularly for ultra-shallow junction depths. Laser thermal annealing may be performed after ion implantation of a dopant and involves heating the doped area with a laser. The laser radiation rapidly heats the exposed silicon such that the silicon begins to melt. The diffusivity of dopants into molten silicon is about eight orders of magnitude higher than in solid silicon. Thus, the dopants distribute almost uniformly in the molten silicon and the diffusion stops almost exactly at the liquid/solid interface. The heating of the silicon is followed by a rapid quench to solidify the silicon, and this process allows for non-equilibrium dopant activation in which the concentration of dopants within the silicon is above the solid solubility limit of silicon. Advantageously, this process allows for ultra-shallow source/drain regions that have an electrical resistance about one-tenth the resistance obtainable by conventional rapid thermal annealing.

A problem associated with source/drain regions is the formation of end-of-range defects, which are believed to stem from an interstitial-rich region proximate the lower portion of the amorphous silicon region. These interstitial-rich regions are formed during doping of the source/drain regions. Referring to FIG. 1, an amorphous silicon region 35 is formed during the doping of a silicon substrate 10 to form source/drain regions. The amorphous silicon region 35 has a lower portion characterized by an interstitial-rich region 33. After the activation anneal and upon recrystallization of surface amorphous region 35, interstitials in the interstitial-rich region 33 are believed to agglomerate, thereby generating end-of-range defects, such as dislocations and stacking faults, bordering the lower portion of surface amorphous region 35. When these end-of-range defects are present in the source/drain region, the defects disadvantageously cause junction leakage. Accordingly, a need exists for an improved laser anneal process that minimizes the effects of end-of-range defects in the source/drain region.

SUMMARY OF THE INVENTION

This and other needs are met by embodiments of the present invention which provide a method of manufacturing a semiconductor device that reduces the effects of end-of-range defects. The method comprises forming a gate electrode over a substrate, then implanting inert dopants into the substrate to form a substantially amorphous region in the substrate proximate to the gate electrode, the amorphous region extending to a first depth below a main surface of the substrate and forming a defect region at the first depth. Source/drain dopants are implanted into the amorphous region to form a doped region extending to a second depth below the main surface, the second depth being less than the first depth, and the amorphized region is laser thermal annealed to form a recrystallized source/drain region having a junction above and spaced apart from the defect region.

In another embodiment of the present invention, a semiconductor device is disclosed that includes a substrate; a gate electrode; source/drain regions having a junction at a first depth below a main surface of the substrate; and an end-of-range defect region at a second depth below the main surface greater than the first depth such that the defect region is spaced apart from the junction.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention addresses the problem of junction leakage as a result of end-of-range defects in the source/drain regions. This is achieved, in part, by forming an amorphous region to a depth significantly greater than the desired source/drain junction depth, implanting source/drain dopants to about the desired junction depth, then laser thermal annealing. Because the recrystallization front velocity towards the substrate main surface is greater than the dopant atom velocity in the liquid substrate during laser thermal annealing, the junction is not pushed down to the amorphous/crystalline silicon interface. Thus, end-of-range defects are located in a region below and spaced apart from the junction, and the defects are not located in the activated source/drain region. Junction leakage as a result of the end-of-range defects is thereby reduced by the present invention.

An embodiment of the present invention is illustrated in FIGS. 2A–2F. A silicon substrate 200 is provided and can be formed from any material suitable for integrated circuit manufacture. For example, substrate 200 can be formed from single-crystal silicon, with a <100> crystallographic orientation and which has been slightly doped with n-type or p-type impurities. Separate MOS devices are separated on substrate 200 using isolation structures, such as a field oxide or a shallow isolation trench (not shown).

Figure 1:
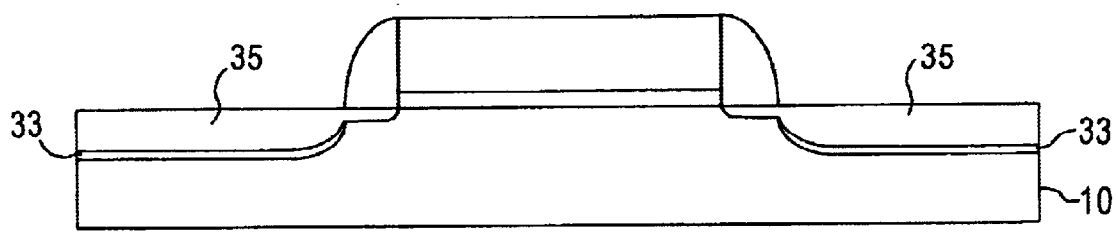
FIG. 1 schematically illustrates end-of-range defects found in an amorphous region of a doped silicon substrate.
Figure 2A:
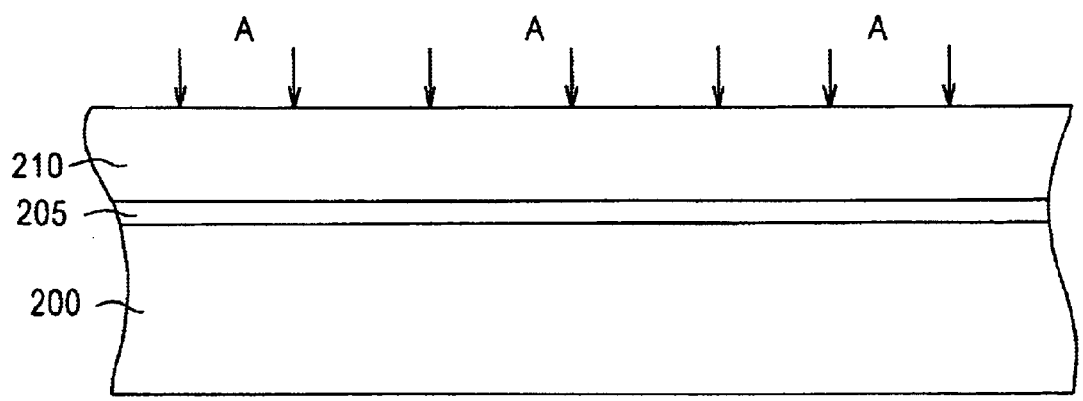
FIGS. 2A–2F schematically illustrate sequential phases of a MOS fabrication method using a laser thermal annealing process according to an embodiment of the present invention.

Referring now to FIG. 2A, a gate oxide 205, comprised of silicon dioxide, is formed on the top surface of substrate 200, for example, using thermal oxidation at temperatures from about 700 to 1000° C. in an oxygen-steam ambient. Although not limited in this manner, gate oxide 205 can have a thickness from about 30 to 200 angstroms.

After deposition of gate oxide 205, a gate electrode is formed over the gate oxide 205. The formation of a gate electrode typically involves depositing a blanket layer of undoped polysilicon 210, as by low pressure chemical vapor deposition (LPCVD) at temperatures from about 600 to 800° C., on the top surface of gate oxide 205. Although not limited in this manner, polysilicon layer 210 can have a thickness from about 500 to 5000 angstroms. Polysilicon layer 210 can then be implanted with nitrogen ions, as depicted by arrows A. The implanted nitrogen ions, for example, can be used to retard the diffusion of subsequently implaned boron atoms. The implantation of the nitrogen ions can be at a dosage from about $5 \times 10^{14}$ to $5 \times 10^{15}$ dopants/cm$^2$ and at an energy level from about 20 to 200 keV.

Figure 2B:
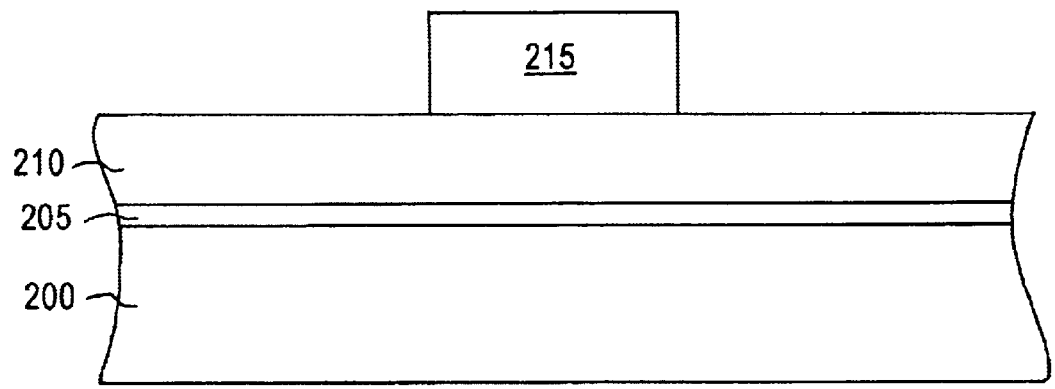

In FIG. 2B, the layers over gate oxide 205 are etched to form a gate electrode. The etching of the gate electrode typically involves forming a photoresist mask 215 on polysilicon layer 210, wherein a blanket layer of photoresist is selectively irradiated using a photolithographic system, such as a step and repeat optical projection system, in which ultraviolet light from a mercury-vapor lamp is projected through a first reticle and a focusing lens to obtain a first image pattern. The photoresist layer is then developed, and the irradiated portions of the photoresist are removed to provide openings in the photoresist, thereby creating the photoresist etch mask 215. The openings in photoresist mask 215 expose portions of polysilicon layer 210, which will thereby define the gate electrode.

Figure 2C:
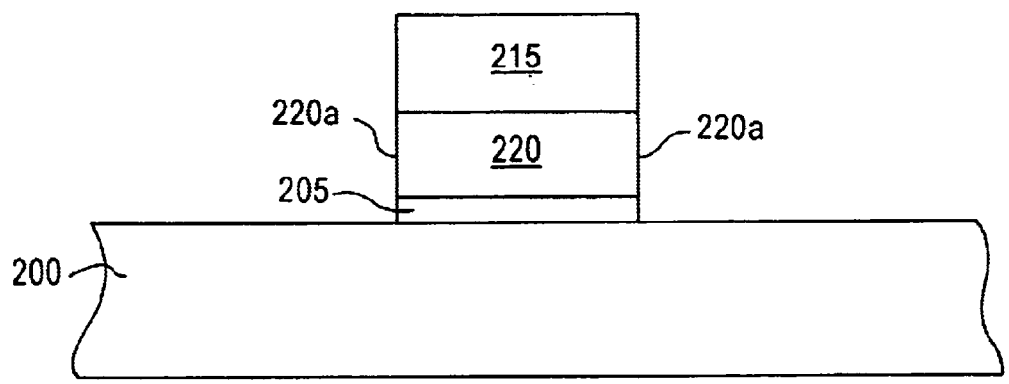

In FIG. 2C, an etch, typically anisotropic, is performed to remove the exposed portions of polysilicon layer 210 and the underlying portions of gate oxide 205. After etching, the remaining portion of polysilicon layer 210 provides a gate electrode 220 having opposing vertical sidewalls 220a. Although not limited in this manner, the width of gate electrode 220 between sidewalls 220a can be from about 500 to 2500 angstroms.

Figure 2D:
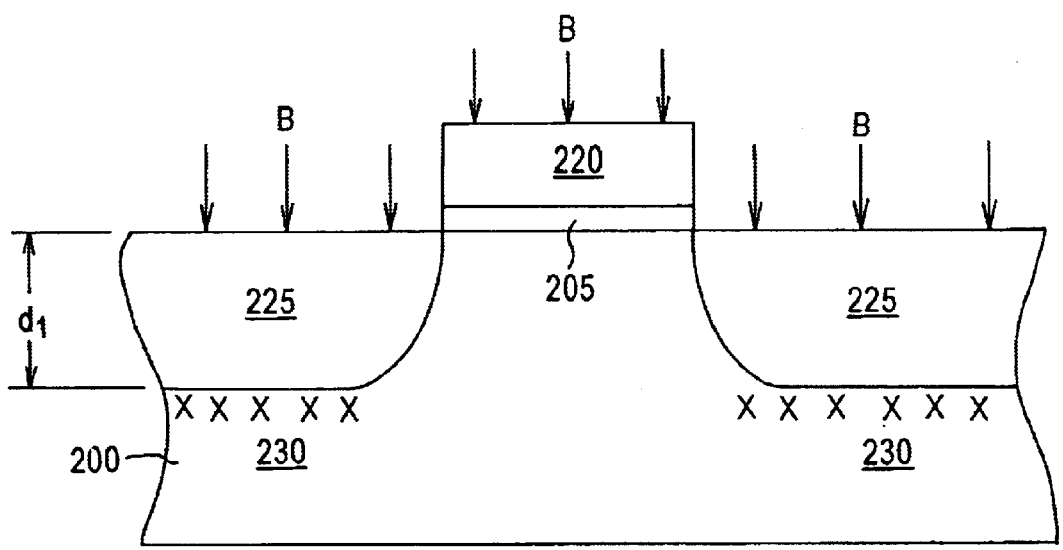

In FIG. 2D, photoresist mask 215 is stripped off gate electrode 220. Then a pre-amorphization implant (PAI) is performed by implanting substantially inert ions such as germanium, silicon or xenon, as shown by arrows B. The ions are accelerated at high velocity into crystalline substrate 200 to create amorphous silicon regions 225 extending to a depth $d_1$ below the main surface 200a of substrate 200, and self-aligned with gate electrode 220. As a result of this amorphization process, end-of-range defect regions 230 are created at the bottom of amorphous regions 225.

Figure 2E:
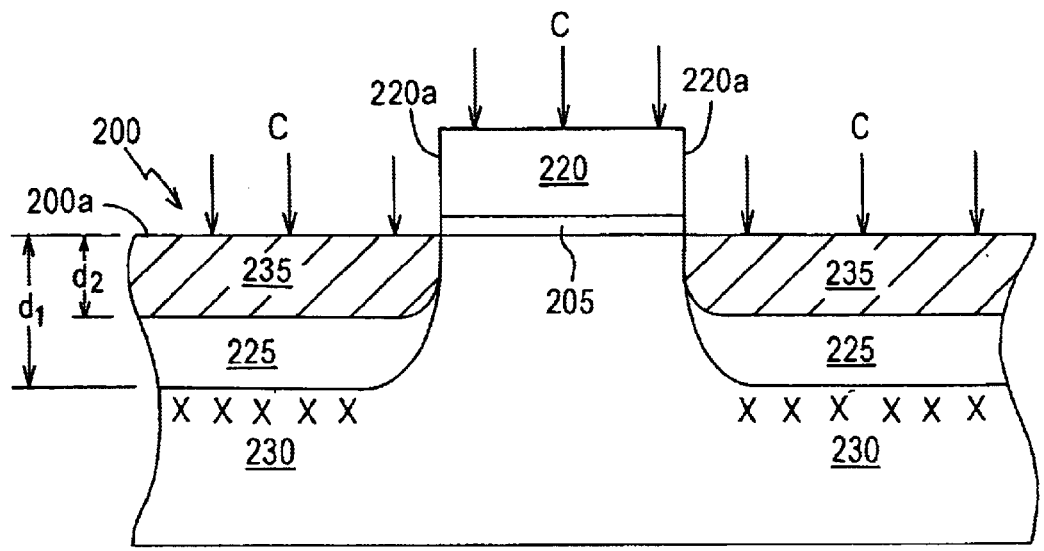

Next, as shown in FIG. 2E, source/drain implant regions 235 are formed by an ion implantation, as represented by arrows C, extending to a depth $d_2$ below main surface 200a. The ion implantation may be an n-type dopant, such as arsenic or phosphorus, if an NMOSFET is desired, or a p-type dopant, such as boron, if a PMOSFET is desired. Depth $d_2$ is less than $d_1$, such that the bottom, or "tail" of implants 235 are well within amorphous regions 225 and spaced apart from end-of-range defect regions 230. In one embodiment of the present invention, depth $d_2$ is about half of depth $d_1$. Amorphous regions 225 are formed to a depth $d_1$ of about 300 Å to about 600 Å; e.g., about 300 Å, by performing the PAI with a silicon implant species at an energy of about 10 keV and a dosage of about 1e15 atoms/cm$^2$, or with a germanium implant species at about 15 keV and 1e15 atoms/cm$^2$, or with a xenon species at about 30 keV and 1e15 atoms/cm$^2$. Source/drain implants 235 are formed to a depth d2 of about 150 Å by performing the ion implantation at an energy and dosage of about 500 eV and 1e15 atoms/cm$^2$ for boron, respectively, or at an energy and dosage of about 2 to 3 keV and 1e15 atoms/cm$^2$ for phosphorus and arsenic. Source/drain implants 235 are formed within substrate 200 immediately adjacent to sidewalls 220a and are self-aligned with the gate electrode 220.

In other embodiments of the present invention, depth $d_1$ of the amorphous silicon region is greater than twice that of the desired junction depth $d_2$; for example, $d_1$ is about three times greater than $d_2$. The spacing of depth $d_1$ below depth $d_2$ is dependent on the device design's tolerance for junction leakage. If there is a low tolerance for junction leakage, depth $d_1$ and depth $d_2$ need to be spaced farther apart.

Figure 2F:
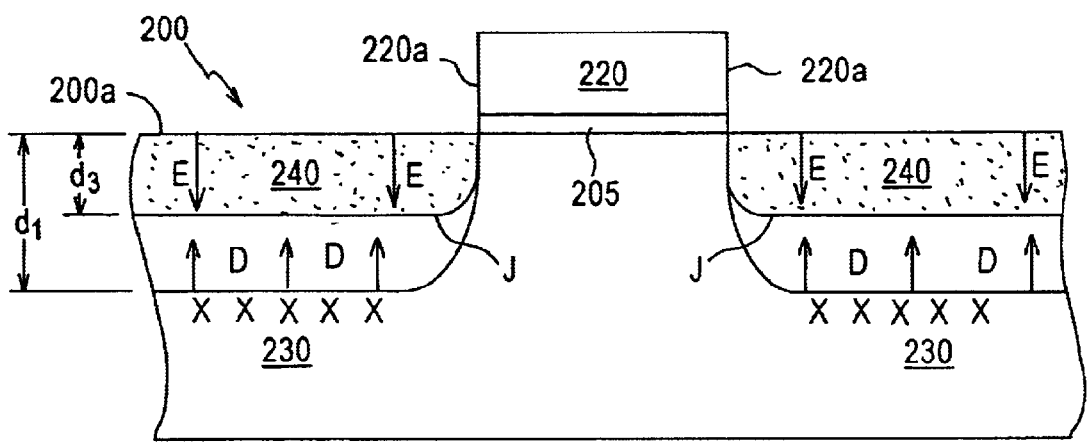

Referring now to FIG. 2F, laser thermal annealing (LTA) is then conducted to liquify substrate 220 down to depth $d_1$ to activate source/drain implants 235 and to recrystallize amorphous regions 225, thereby forming source/drain regions 240 having junctions J above and spaced apart from end-of-range defect regions 230. For example, the junction depth $d_3$ can be about equal to depth $d_2$. Junctions J having desired junction depth $d_3$ are formed upon laser thermal annealing because a recrystallization front velocity (shown by arrows D) of amorphous regions 225 towards main surface 220a is greater than a dopant atom velocity (shown by arrows E) of source/drain implants 235 away from main surface 220a. For example, if the recrystallization velocity towards main surface 220a is about 8 meters/sec and the dopant atom velocity into substrate 220 is about 2 meters/sec, junctions J will be formed above the amorphous/crystal interface, where junctions J would be susceptible to junction leakage due to end-of-range defect regions 230. It should be noted that the greater the depth $d_1$ of amorphous region 225, the further end-of-range defects 230 will be from junctions J after LTA. However, if depth $d_1$ is too great, amorphous region 225 will not completely recrystallize before source/drain implant 235 diffluses into substrate 200, resulting in junction leakage paths and adverse device performance.

In one embodiment of the present invention, wherein substrate 200 is bulk silicon, conventional laser thermal annealing is conducted using a pulse length of about 100 nanoseconds to provide an energy of about 0.4 to about 0.54 joules/cm$^2$. In the case where substrate 200 is an SOI (silicon on insulator) substrate, laser thermal annealing is conducted using a pulse length of about 100 nanoseconds to provide an energy of about 0.15 joules/cm$^2$. Alternatively, a shorter pulse length than 100 nanoseconds can be employed, resulting in the liquified silicon being cooler and recrystallization occurring faster, as long as the pulse provides enough energy to fully melt the amorphous silicon region. In other words, the less-than-100 nanosecond pulse must provide the 0.54 joules/cm$^2$ necessary to melt bulk silicon (or the 0.15 joules/cm$^2$ necessary to melt an SOI substrate region).

In subsequent processing steps, spacers (not shown) are formed on sidewalls 220a of gate electrode 220, as by blanket depositing a spacer material, such as silicon nitride, over substrate 200 and anisotropic etching. After formation of the sidewall spacers, heavily doped (HDD) or moderately doped (MDD) source/drain regions are formed by a second ion implantation. The sidewall spacers act as masks, which protect portions of the source/drain regions 240 (also called "source/drain extensions") from being heavily doped. The present methodology can be employed either before gate sidewall spacer formation, as described above with reference to FIGS. 2A–F, or after spacer formation. The present invention is particularly useful before spacer formation to form source/drain extensions such as regions 240, whose junctions must be very shallow, abrupt and highly active. In this way, the present invention can be employed to take full advantage of the strong points of the LTA process.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well-known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A method of manufacturing a semiconductor device, comprising the steps of:
   forming a gate electrode over a substrate;
   implanting substantially inert dopants into the substrate to form a substantially amorphous region in the substrate proximate to the gate electrode, the amorphous region extending to a first depth below a main surface of the substrate and forming a defect region at the first depth;
   implanting source/drain dopants into the amorphous region to form a doped region extending to a second depth below the main surface, the second depth being less than the first depth; and
   laser thermal annealing the amorphized region to form a recrystallized source/drain region having a junction above and spaced apart from the defect region.

2. The method of claim 1, wherein the junction is formed at about the second depth.

3. The method of claim 1, comprising laser thermal annealing such that a recrystallization velocity of the amorphous region towards the main surface is greater than a dopant atom velocity of the source/drain dopants away from the main surface.

4. The method of claim 1, comprising implanting the source/drain dopants such that the second depth is approximately half of the first depth.

5. The method of claim 4, comprising implanting such that the first depth is about 300 Å and the second depth is about 150 Å.

6. The method of claim 3, wherein the substrate consists of silicon, comprising laser thermal annealing at about a 100 nanosecond pulse length.

7. The method of claim 6, comprising laser thermal annealing such that the recrystallization velocity is about 8 meters/sec and the dopant atom velocity is about 2 meters/sec.

8. The method of claim 6, comprising laser thermal annealing at an energy of about 0.4 joules/cm2 to about 0.54 joules/cm2.

9. The method of claim 3, wherein the substrate is a silicon-on-insulator substrate, comprising laser thermal annealing at about a 100 nanosecond pulse length at an energy of about 0.15 joules/cm2.

10. The method of claim 3, comprising laser thermal annealing at a pulse width shorter than 100 nanoseconds to melt the amorphous region.

11. The method of claim 1, comprising implanting the source/drain dopants such that the first depth is greater than twice the second depth.

12. The method of claim 11, wherein the first depth is about three times that of the second depth.

* * * * *